(12) United States Patent
Ashley et al.

(10) Patent No.: US 8,207,875 B2
(45) Date of Patent: Jun. 26, 2012

(54) ENCODER THAT OPTIMIZES BIT ALLOCATION FOR INFORMATION SUB-PARTS

(75) Inventors: James P. Ashley, Naperville, IL (US); Udar Mittal, Bangalore (IN)

(73) Assignee: Motorola Mobility, Inc., Libertyville, IL (US)

( * ) Notice: Subject to any disclaimer, the term of this patent is extended or adjusted under 35 U.S.C. 154(b) by 447 days.

(21) Appl. No.: 12/607,439

(22) Filed: Oct. 28, 2009

(65) Prior Publication Data

US 2011/0096830 A1   Apr. 28, 2011

(51) Int. Cl.
H03M 7/34   (2006.01)
(52) U.S. Cl. .......................... 341/51; 341/107
(58) Field of Classification Search .................. 341/107, 341/51; 382/246–247
See application file for complete search history.

(56) References Cited

U.S. PATENT DOCUMENTS

| | | | |
|---|---|---|---|
| 5,692,102 A | 11/1997 | Pan | |
| 5,729,655 A | 3/1998 | Kolesnik et al. | |
| 6,236,960 B1* | 5/2001 | Peng et al. | 704/211 |
| 6,445,686 B1 | 9/2002 | Hoffbeck et al. | |
| 6,662,154 B2 | 12/2003 | Mittal et al. | |
| 6,700,513 B2* | 3/2004 | McGuire | 341/107 |
| 7,230,550 B1 | 6/2007 | Mittal et al. | |
| 7,461,106 B2* | 12/2008 | Mittal et al. | 708/200 |
| 2001/0033699 A1 | 10/2001 | Eshraghian | |
| 2002/0015415 A1 | 2/2002 | Sugino et al. | |
| 2004/0141572 A1 | 7/2004 | Johnson et al. | |
| 2010/0088090 A1 | 4/2010 | Ramabadran | |
| 2010/0231426 A1* | 9/2010 | Van Der Vleuten | 341/107 |

OTHER PUBLICATIONS

James P. Ashley, Edgardo M. Cruz-Zeno, Udar Mittal, and Weimin Peng, "Wideband Coding of Speech Using a Scalable Pulse Codebook", Proc. of the 2000 IEEE Workshop on Speech Coding, Sep. 2000, pp. 148-150.

Udar Mittaf, James P. Ashley, and Edgardo M. Cmz-Zeno, "Coding Unconstrained FCB Excitation Using Combinatorial and Huffman Codes", 2002, IEEE Workshop Proceedings., 2002, pp. 129-131.

Udar Mittal, James P. Ashley, and Edgardo M. Cruz-Zeno, "Low Complexity Factorial Pulse Coding of MDCT Coefficients Using Approximation of Combinatorial Functions", in Proc. IEEE ICASSP, Honolulu, HI, USA, Apr. 2007, vol. 1, pp. 289-292.

Tenkasi V. Ramabadran, "A Coding Scheme for rn-out-of-n Codes", IEEE Transactions on Communications, vol. 38, No. 8, Aug. 1990, pp. 1156-1163.

"Low-complexity coding at 24 and 32 kbit/s for hands-free operation in systems with low frame loss", ITU-T G.722.1 Telecommunication Standardization Sector of ITU (May 2005), 36 pages.

(Continued)

Primary Examiner — Khai M Nguyen
(74) Attorney, Agent, or Firm — Roland K. Bowler, II

(57) ABSTRACT

A encoder/decoder architecture (200, 300, 700) that uses an arithmetic encoder (220) to encode the MSB portions of the output of a Factorial Pulse Coder (212), that encodes the output of a first-level source encoder (210), e.g., MDCT. Sub-parts (e.g., frequency bands) of portions (e.g., frames) of the signal are suitably sorted in increasing order based on a measure related to signal energy (e.g., signal energy itself). Doing this in a system (100) that overlays Arithmetic Encoding on Factorial Pulse coding results in bits being re-allocated to bands with higher signal energy content, ultimately yielding higher signal quality and higher bit utilization efficiency.

23 Claims, 6 Drawing Sheets

OTHER PUBLICATIONS

"Frame error robust narrowband and wideband embedded variable bit-rate coding of speech and audio from 8-32 kbit/s", ITU-T G.718 Telecommunication Standardization Sector of ITU, (Jun. 2008).

Sean A. Ramprashad, "Sparse Bit-Allocations Based on Partial Ordering Schemes With Application to Speech and Audio Coding", IEEE Transactions on Audio, Speech, and Language Processing, vol. 15, No. 1, Jan. 2007, pp. 57-69.

Xiang Wei, Martyn J. Shaw and Martin R. Varley, "Optimum Bit Allocation and Decomposition for High Quality Audio Coding",1997 IEEE International Conference on Acoustics, Speech, and Signal Processing (ICASSP'97)—vol. 1, pp. 315-318.

Valin et al., "A High-Quality Speech and Audio Codec With Less Than 10 ms Delay" IEEE Transactions on Audio, Speech, and Language Processing, Jan. 2010, vol. 18, Iss 1, pp. 58-67.

Patent Cooperation Treaty, "PCT Search Report and Written Opinion of the International Searching Authority" for International Application No. PCT/US2010/053521 Feb. 18, 2011, 11 pages.

Mittal et al., "Encoder and Decoder Using Arithmetic Stage to Compress Code Space That is Not Fully Utilized" U.S. Appl. No. 12/607,418, filed Oct. 28, 2009.

Patent Cooperation Treaty, "PCT Search Report and Written Opinion of the International Searching Authority" for International Application No. PCT/US2010/053016 Feb. 18, 2011, 11 pages.

Abramson, N., "Information Theory and Coding", New York: McGraw-Hill, 1963. pp. 61-62.

Jones, C.B., "An Efficient Coding System for Long Source Sequences," IEEE Transactions on Information Theory, vol. IT-27, No. 3, pp. 280-291, May 1981.

Patent Cooperation Treaty, "PCT Search Report and Written Opinion of the International Searching Authority" for International Application No. PCT/US2009/058779 Feb. 16, 2010, 17 pages.

Garrido C.M. et al., "Towards iLBC Speech Coding at Lower Rates Through a New Formulation of the Start State search" 2005 IEEE International Conference on Acoustics, Speech, and Signal Processing, Piscataway, NJ, USA, Vo. 1, Mar. 18, 2005, pp. 769-772.

Geiger R. et al., "ISO/IEC MPEG-4 High-Definition Ascalable Advanced Audio Coding" Journal of the Audio Engineering Society, Audio Engineering Society, New York, NY, USA, vol. 5, No. 1/2, a Jan. 2007, pp. 27-43.

United States Patent and Trademark Office, "Non-Final Rejection" for U.S. Appl. No. 12/607,418 Dec. 29, 2010, 12 pages.

United States Patent and Trademark Office, "Notice of Allowance and Fees Due" for U.S. Appl. No. 12/607,418 Mar. 16, 2011, 16 pages.

United States Patent and Trademark Office, "Non-Final Rejection" for U.S. Appl. No. 12/247,440 dated Oct. 20, 2011, 13 pages.

\* cited by examiner

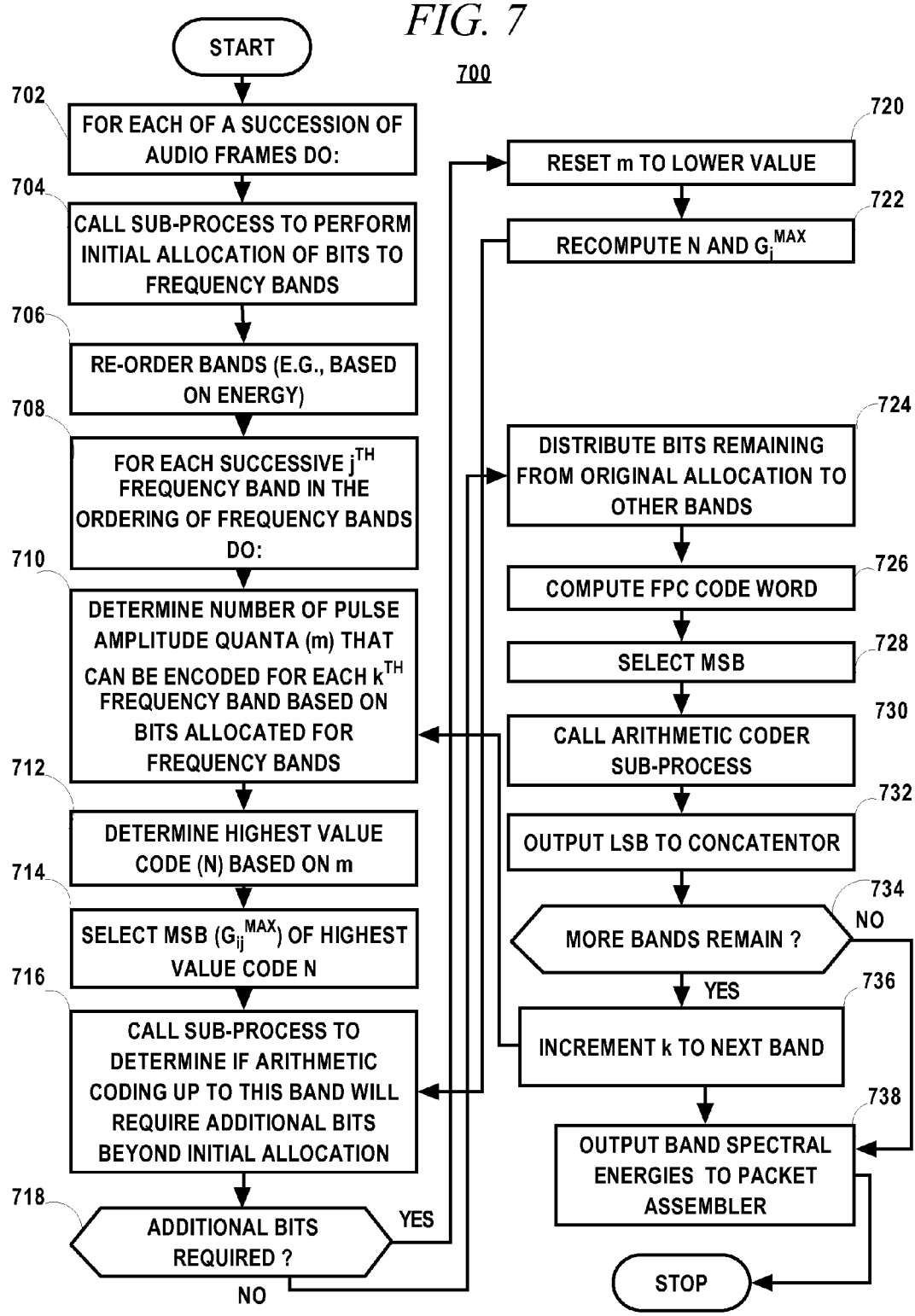

ENCODER THAT OPTIMIZES BIT ALLOCATION FOR INFORMATION SUB-PARTS

FIELD OF THE INVENTION

The present invention relates generally to efficient digital encoding and decoding.

BACKGROUND

In the last twenty years microprocessor speed increased by several orders of magnitude and Digital Signal Processors (DSPs) became ubiquitous. It became feasible and attractive to transition from analog communication to digital communication. Digital communication offers the major advantage of being able to more efficiently utilize bandwidth and allows for error correcting techniques to be used. Thus by using digital technology one can send more information through a given allocated spectrum space and send the information more reliably. Digital communication can use radio links (wireless) or physical network media (e.g., fiber optics, copper networks).

Digital communication can be used for different types of communication such as audio, video or telemetry for example. A digital communication system includes a sending device and a receiving device. In a system capable of two-way communication each device has both sending and receiving circuits. In a digital sending or receiving device there are multiple staged processes through which data is passed between the stage at which it is input through an input (e.g., microphone, camera, sensor) and the stage at which it is used to modulate a carrier wave and transmitted. After (1) being input and then digitized, (2) some initial noise filtering may be applied, followed by (3) source encoding and (4) finally channel encoding. The present invention as will be described in the succeeding pages can be considered to fall in the source encoding stage.

The main goal of source encoding is to reduce the bit rate while maintaining perceived quality to the extent possible. Different standards have been developed for different types of media. For example the JPEG standard applies to still images while the IS-127 standard applies to audio. In a concession to practicality, source encoders are often designed with using vector lengths corresponding to a DSP register length or an even multiple a multiple of the DSP register length (e.g., 128 bits). Now for each application there is some limit on the allocated channel bandwidth. Based on this limit, the designer of the source encoder/decoder will settle on a certain number of possible codes in view of all the degrees of freedom of each portion of the media being encoded. For example, in the case of audio encoding, there may be a certain frame size established (e.g., 160 samples long), a certain number of allowed audio pulses in each audio frame, and a certain number of total amplitude quanta to be allocated to the pulses. The choices made by the designer are intended to maximize the perceptual quality while staying within the allocated bandwidth. Because everything is discrete and quantized one can enumerate the total number of unique frames. The total number of unique possibilities for each frame is closely related to the allocated bandwidth because it must be possible to send through the channel during the time interval of the audio frame sufficient information to identify the one unique frame which best corresponds to the audio during that frame. The larger the total number of unique frames, the more information is required to uniquely identify one particular frame. Now it may so happen that the total number of unique frames (n) is not a power of two, i.e., $n \neq 2^k$, where k is an integer. Assume for example that $n<2^k$ in this case if one were to use a k bit integer to represent each frame there would always be some range of higher valued integers near $2^k$ that would never be sent. This represents an inefficiency in the system, because one has allocated k bits but the k bits are not fully utilized.

U.S. Pat. No. 7,230,550 discloses a method of addressing the aforementioned inefficiency by splitting a set of multi-bit codewords into Most Significant Bit (MSB) portions and Least Significant Bit (LSB) portions and combining the MSB portions and LSB portions in a manner that reduces the overall bit size needed to represent the set. Unfortunately if a large number of codewords are to be processed in this manner as may be called for in a high bandwidth, high fidelity system, the method of the '550 patent would require a high precision multiplication operations to be performed. This is computational expensive and therefore disadvantageous Although the example above is with reference to audio and discusses frames, more generally different types of media (e.g., image, video, telemetry & audio) may be characterized (in whole or in part) by one of n possible codes, where n is an integer (possibly selected based on bandwidth limits) but is not a power of 2 e.g., $n \neq 2^k$ where k is an integer. Analogously, there would also arise an inefficiency in such a generalized case.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

FIG. 7 is a flowchart of an audio encoding method that uses Arithmetic Coding in combination with Factorial Pulse Coding.

Figure 1:
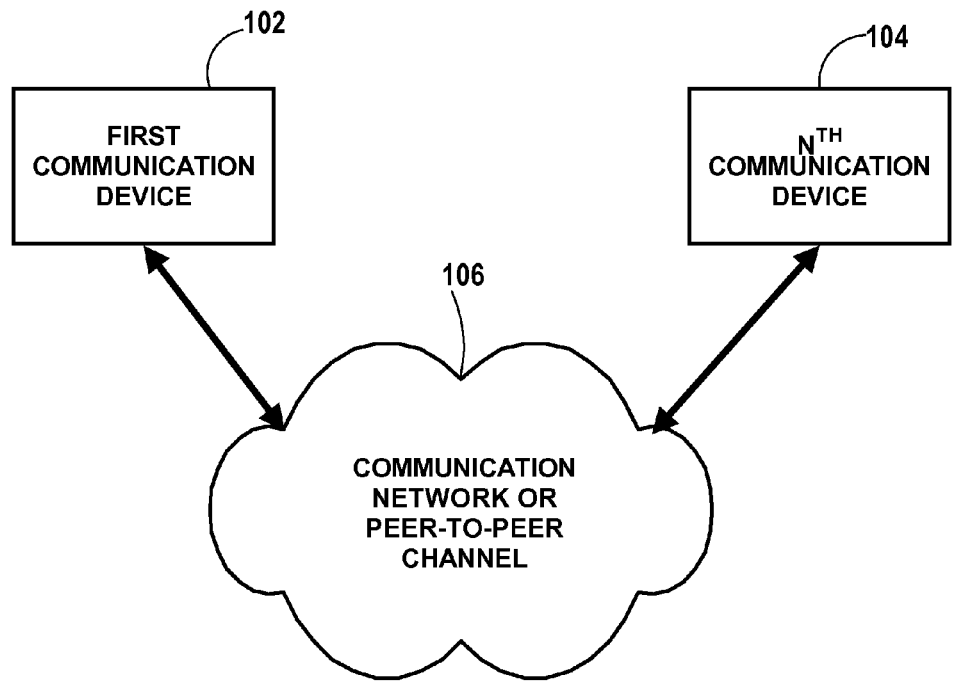
FIG. 1 is a block diagram of a communication system according to an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to encoders and decoders. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of encoders and decoders described herein. The non-processor circuits may include, but are not limited to, a radio receiver, a radio transmitter, signal drivers, clock circuits, power source circuits, and user input devices. As such, these functions may be interpreted as steps of a method to perform encoding and decoding. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

FIG. 1 is a block diagram of a communication system 100 according to an embodiment of the invention. The communication system 100 includes a first communication device 102 and an $N^{TH}$ communication device 104 communicatively coupled through a communication network or peer-to-peer channel 106. At least one of the communication devices 102, 104 includes a transmitter and at least one of the communication devices 102, 104 comprises a receiver. Certain embodiments provide for two-way communication in which case both communication devices 102, 104 include both a transmitter and a receiver.

Figure 2:
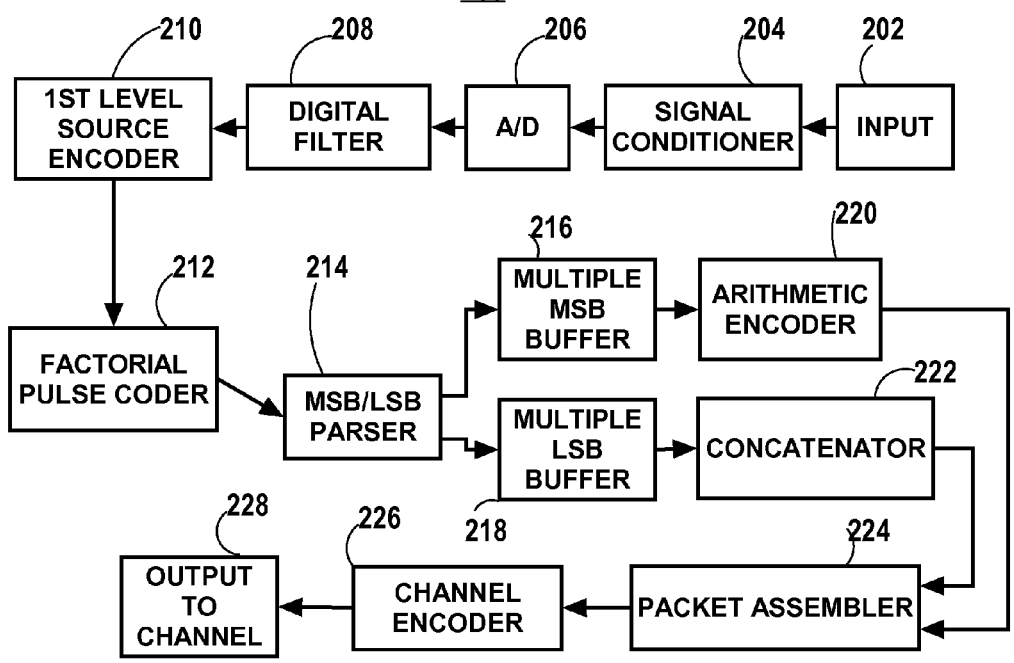
FIG. 2 is a block diagram of a transmitter of a device used in the communication system shown in FIG. 1.

FIG. 2 is a block diagram of a transmitter 200 of a device 102, 104 used in the communication system shown in FIG. 1. The transmitter includes an input 202 which can take different forms depending on the type of information being transmitted. In the case of audio, the input 202 suitably takes the form of a microphone; in the case of video, the input 202 suitably takes the form of an image sensor; and in the case of telemetry, the input can take the form of a sensor.

The input 202 is coupled to a signal conditioner 204. The signal condition can for example comprise analog-domain filtering and/or amplification.

This signal condition 204 is coupled to an analog-to-digital converter (A/D) 206 that digitizes the signal received from the signal conditioner 204.

The A/D 206 is coupled to a digital filter 208 which is used to perform additional filtering in the digital-domain.

The digital filter is coupled to a first-level source encoder 210. The first level source encoder 210 can, for example, comprise an Algebraic Code Excited Linear Prediction (ACELP) encoder (which is a type of audio encoder), a Modified Discrete Cosine Transform (MDCT) encoder (which can be applied to many different types of signals), or any type of signal encoder which may act as a pre-encoder or pre-processing stage. Now, the first-level source encoder will ordinarily segment the incoming data into discrete blocks (such as audio frames of prescribed duration (corresponding to a certain number of samples), or small blocks of an image) and encode these blocks one at a time. (Note that this does not exclude differential encoding relative to preceding frames or blocks.) At this point in the system everything is quantized and discretized so that there is a finite number of different possible signal vectors for each discrete block. The resolution of the discretization and quantization may be designed based on such practical considerations as the length of register of a Digital Signal Processor (DSP) used to implement the system. The discretization and quantization as well as other aspects of the first level source encoder 210 are also suitably based on perceptual consideration or more generally speaking based on transmitted signal quality requirements. At the far end of the transmitter 200 i.e., at an output to channel 228 there is another constraint, namely the maximum channel bandwidth that also must be accommodated. Achieving a fine balance between signal quality considerations and available bandwidth will generally lead to a design of the source encoder 210, 212 in which the number of possible signal vectors may not happen to be an integer power of 2 (i.e., $n \neq 2^k$, where n is the number of possible signal vectors and k is any integer). In this common situation, there would be a distinct inefficiency in the system if one were to transmit a k bit code word to identify one of the n possible signal vectors for each discrete block of data. This inefficiency which will be apparent to persons of ordinary skill in information theory, arises because certain values of the k bit integer (code word) would never be sent because $n < 2^k$, but nonetheless all k bits are required to be sent. In this situation the k bit code words representation one of n signal vectors are said to have "non-integer" length.

Referring again to FIG. 2 it is seen that the first level source encoder 210 is coupled to a Factorial Pulse Coder (FPC) 212. An FPC is one type of coder that can produce k bit code words to represent n bit signal vectors. An early Factorial Pulse Coder is described in U.S. Pat. No. 6,236,960 to Weimin Peng et al. which is assigned in common with the present invention. A basic FPC works by establishing an ordering of all possible signal vectors and generating an integer codeword that points to a particular signal vector in the ordering. The particular signal vector is characterized by a certain unique combination of non-zero positions, magnitudes, and signs. Thus instead of transmitting the signal vector, the integer codeword is transmitted. U.S. Pat. No. 7,461,106 entitled "Apparatus and Method for Low Complexity Combinatorial Coding of Signals" provides advancements of FPC which use approximations of the combinatorial functions described in the '960 patent in order to reduce the computational cost of encoding and decoding. The above described inefficiency due to non-integer length code words persists at the output of the FPC 212. The inefficiency is addressed by the provision of successive stages of the transmitter as will be described presently.

The factorial pulse coder 212 is coupled to a MSB/LSB parser 214. The MSB/LSB parser 214 divides each multi-bit code received from the FPC 212 into a Most Significant Bits portion (MSB) and a Least Significant Bits portion (LSB). Splitting the code words at this point is the first stage in addressing the inefficiency mentioned above. The LSB portions may take on all possible values and therefore these bits would be more fully utilized. The MSB may not fully utilized, so by splitting the MSB and LSB apart the inefficiency is isolated in the MSB. According to alternative embodiments of the invention another type of combinatorial encoding and decoding is used in lieu of FPC coding. Similar benefit can be obtained when using other types of combinatorial encoding and decoding.

According to alternative embodiments of the invention the code words received from FPC are not all the same length (e.g., k bits long). In such case, according to one option the number of bits grouped as the MSB portion is fixed and the number of bits grouped as the LSB portion is allowed to vary. One application where codes words may vary in length is an audio communication system in which the first level source encoder 210 codes separate audio frequency bands separately and allocates a different number of bits for each. This would be justified because different audio bands have different impact on perceived audio quality based on the frequency range they cover and/or the spectral energy they contain.

Referring again to FIG. 2 it is seen that MSB/LSB parser 214 is coupled to a multiple MSB buffer 216 and a multiple LSB buffer 218. Because the LSB portions are fully utilized these can simply be concatenated together. For example in an audio application one can concatenate together the LSB portions derived from all of a set of frequency bands during one audio frame period. The multiple LSB buffer 218 is coupled to a concatenator 222 that concatenates the multiple LSB portions together.

Figure 4:
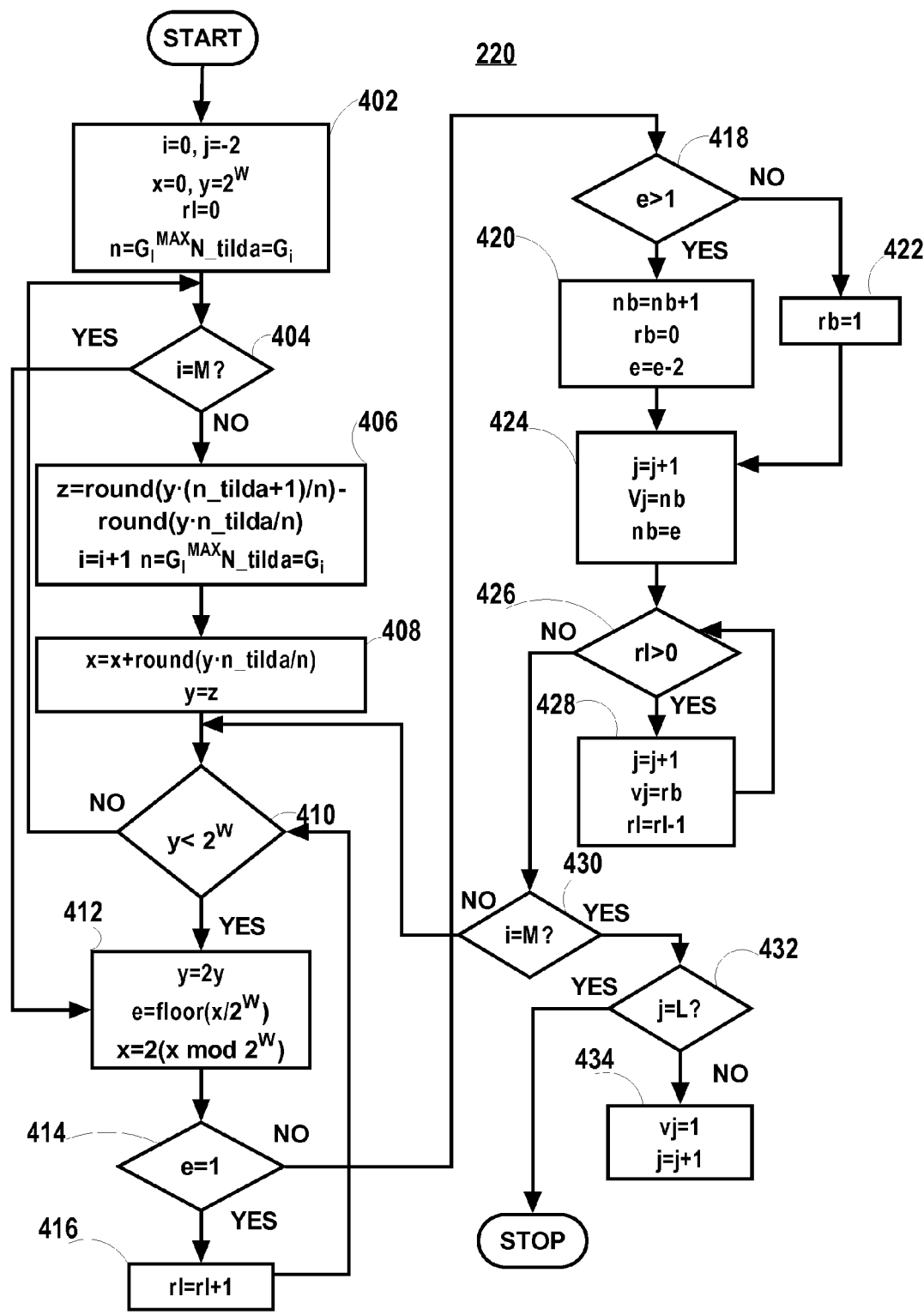
FIG. 4 is a flowchart of an Arithmetic Coder for coding Most Significant Bit portions (MSBs) of codes generated by a preceding encoder (e.g., FPC codes)

The multiple MSB buffer 216 is coupled to an arithmetic encoder 220. Conceptually an arithmetic encoder can be used to uniquely map symbol sequences to a particular sub-range (probability region) of the range zero to one. The first symbol is used to divide the (0,1] range into a number of sub-ranges equal to the number of distinct symbol values (e.g., 2, for binary). The size of the sub-range can be proportional to the probability of the associated symbol value (e.g., 25% chance of zero and 75% chance of 1). One sub-range is selected based on the identity (value) of the symbol. Each successive symbol is used to further subdivide the sub-range identified using its prefix (the sub-sequence of symbols preceding it.) A binary representation of a fractional number that falls within each sub-range (e.g., 11 to represent ¾) is then used as the code to represent the symbol sequence that maps into the sub-range. One type of arithmetic encoder is taught in co-pending patent application Ser. No. 12/247,440 entitled "Arithmetic Encoding For CELP Encoders" (Docket No. CML07096). In that case audio data was reduced to binary sequences, i.e., sequences in which each symbol is either a zero or a one. The arithmetic encoder 220 used in the present invention is more complicated in that the symbols are integer valued and can range from 0 to $G_i^{MAX}$—the maximum value of an $i^{TH}$ MSB portion. In this case rather than each symbol being used to divide a preceding range (or sub-range) into two sub-ranges, each symbol is used to divide a preceding range (or sub-range) into $G_i^{MAX}$ number of sub-ranges. A flowchart of the arithmetic encoder is shown in FIG. 4 and described below. The output of the arithmetic encoder 220 is a code ("arithmetic code") representing a sequence of MSB portions that were received from the multiple MSB buffer 216.

Referring again to FIG. 2 it is seen that the arithmetic encoder 220 and the concatenator 22 are coupled to a packet assembler 224. The packet assembler 224 is coupled to a channel encoder 226 which in turn is coupled to an output to a channel 228. Other information such as spectral band energies can also be provided to the packet assembler.

Figure 3:
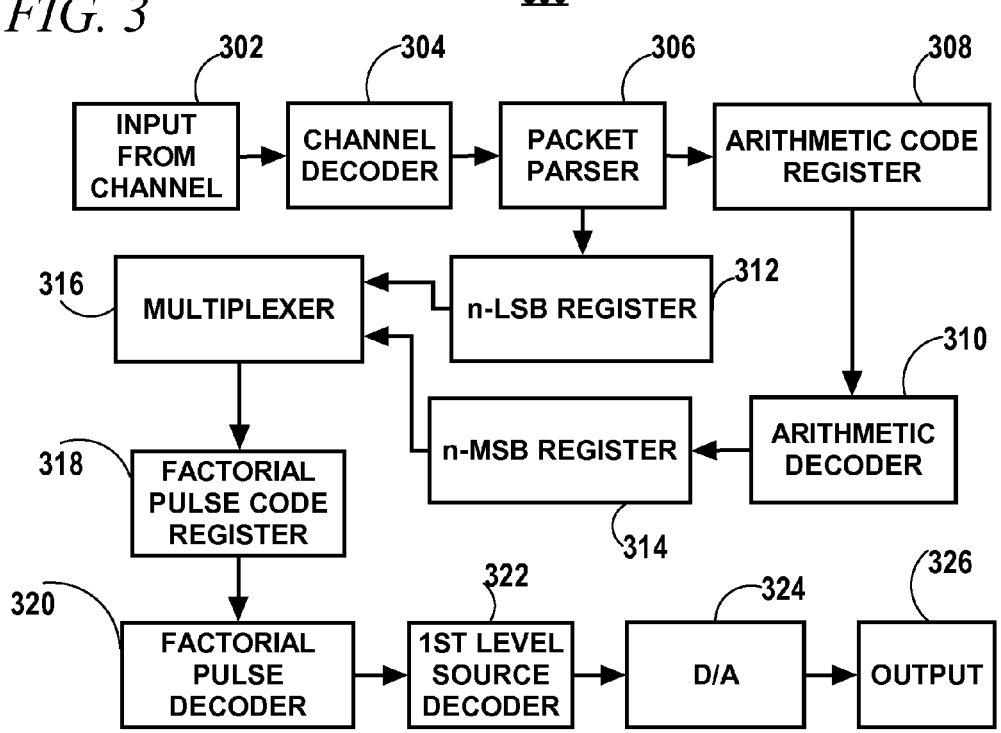
FIG. 3 is a block diagram of a receiver of a device used in the communication system shown in FIG. 1.
Figure 5:
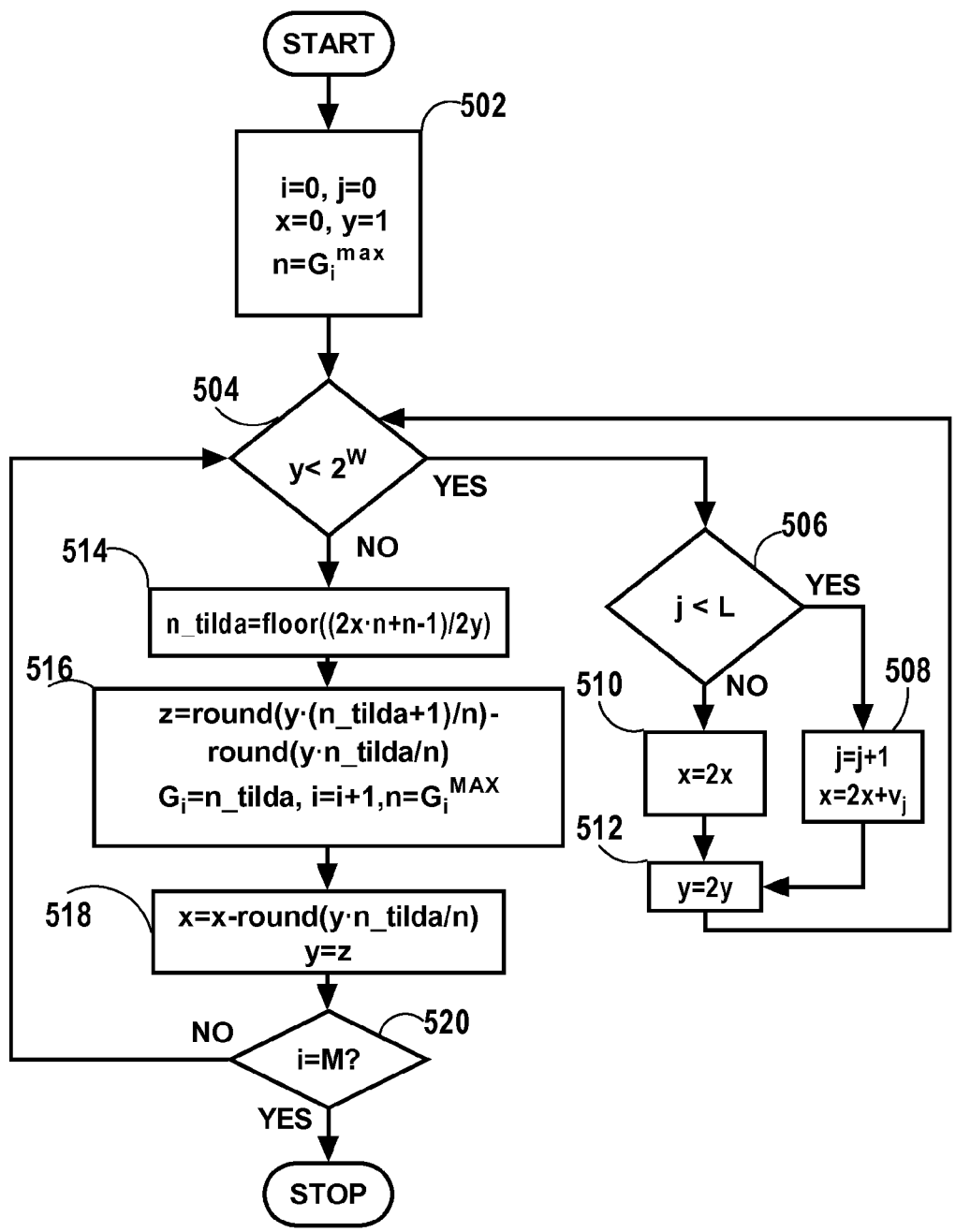
FIG. 5 is a flowchart of an Arithmetic Decoder for decoding Arithmetic Codes that represent MSBs of codes generated by another encoder (e.g., FPC codes)

FIG. 3 is a block diagram of a receiver 300 of a device 102, 104 used in the communication system shown in FIG. 1. Packets sent by the transmitter 300 are received at an input from channel 302 which is coupled to a channel decoder 304, which in turn is coupled to a parser 306. The packet parser 306 is coupled to an n-LSB register 312 and an arithmetic code register 308. The packet parser 306 extracts the concatenated LSBs and delivers them to the n-LSB register 312. The packet parser 306 also extracts the arithmetic code and delivers it to an arithmetic decoder 310. The Arithmetic Decoder 310 is coupled to an n-MSB register 314. The Arithmetic Decoder 310 reverses the encoding and outputs a sequence of MSB portions to the n-MSB register 314. A flowchart of the Arithmetic Decoder 310 is shown in FIG. 5 and described below.

The n-LSB register 312 and the n-MSB register 314 are coupled to a multiplexer 316. The multiplexer 316 is coupled to a FPC register. The multiplexer 316 re-associates corresponding MSBs and LSBs to reconstitute complete FPC code words which are delivered to a Factorial Pulse Code register 318. The FPC register 318 is in-turn coupled to a Factorial Pulse Decoder 320. The Factorial Pulse Decoder 320 reconstructs the coded output of the first level source encoder 210 and delivers it to a first level source decoder 322, which reconstructs the original information (e.g., audio, image data). The first level source decoder 322 is coupled to a Digital-to-Analog converter (D/A) 324 which in turn is coupled to an output 326 (e.g., display, audio speaker).

FIG. 4 is a flowchart of an arithmetic encoder 220 that is used to encode the MSB portions of codes output by a preceding encoder (e.g., factorial pulse encoder). In block 402 an index i, an index j, a variable x, a variable y, and variable rl, a variable n, and a variable n-tilda are initialized. The variable i which identifies a MSB portion in a sequence of MSB portions is initialized to zero in order to point to a first MSB portion in the sequence. A variable j which points to successive bits in a code word to be produced by the arithmetic encoder 310 is initialized to −2 (the first two code bits are not used). The variable x which represents a position in an arithmetic code space range is initialized to zero. A variable y which is a re-scalable variable that represents the width of a sub-range is initialized to $2^w$. Conceptually the code space can be thought of as the range (0,1] but in practice the code space is represented as the range 0 to $2^w$. W is also effectively a precision parameter corresponding the precision of the arithmetic used by the arithmetic encoder 310. Although W is fixed in the flowcharts shown in FIGS. 4-6 alternatively W can be set independently for each $i^{TH}$ symbol. Rl a run-length variable is initialized to zero. n is initialized to $G_i^{MAX}$ with i being set to its initial value 0. $G_i^{MAX}$ is the maximum value of the $i^{TH}$ MSB portion. MSB portions can have different maximum values depending on the design of the first level source encoder 210. For example different bits allocated for coding different frequency bands may lead to different values of $G_i^{MAX}$. n-tilda is initialized to $G_i$ the actual value of the $i^{TH}$ MSB.

After block 402, decision block 404 is a loop termination criteria that tests if all the MSB portions to be coded have been processed. If the outcome is negative (meaning more MSB portions are to be processed) then the flowchart continues with block 406. The first step in block 406 is to the compute a next sub-range size. The next sub-range size is a fraction of the preceding sub-range size determined by the value of $G_i$ (the $i^{TH}$ MSB portion) and $G_i^{MAX}$ (the maximum value of the $i^{TH}$ MSB portion), represented at this point by n-tilda and n respectively. The formula that is used calculate the size of the sub-range is:

$$z = \text{round}\left(\frac{y \cdot (\tilde{n}+1)}{n}\right) - \text{round}\left(\frac{y \cdot \tilde{n}}{n}\right)$$

After the preceding formula is evaluated the is incremented and n and n-tilda are set to $G_i^{MAX}$ and $G_i$ respectively.

Next in block 408 the position in the code space represented by variable x is increased by the rounded value of a fraction of the preceding sub-range size proportional to the ratio of the new values of n-tilda and n. In other words the closer $G_i$ was to $G_i^{MAX}$, the higher the new position in the code space is. Also in block 408 the sub-range size represented by variable y is now set to the new value computed block 406 to which the variable z was set.

Next, decision block 410 test if the value of the variable y is less than $2^W$. If so then the flowchart branches to block 412. Note that if the outcome of decision block 404 was positive then the flowchart also branches to block 412.

In block 412 the variable y which represents the sub-range size is rescaled by a factor of 2 (which in binary arithmetic can be accomplished by a left bit shift). Also, in block 412 an emitted value variable e is set equal to the floor function of the code space position x divided by $2^W$. Next in block 412, in correspondence with the rescaling of y, the value of the position in the code space is reset to two times the value of x mod $2^W$.

Next decision block 414 test if the emitted value variable is equal to 1. If so then the flowchart continues with block 416 in which the run length variable rl is incremented and thereafter the flowchart branches back to decision block 410. When the outcome of decision block 410 is the flowchart branches back to decision block 404.

When the outcome of decision block 414 is negative the flowchart branches to decision block 418. Decision block 418 tests if the emitted variable value is greater than one. If so the flowchart continues with block 420. In block 420 a next bit variable nb is increment by 1, a run bit variable rb is set equal to zero and the emitted variable value e is decremented by 2. If, on the other hand the outcome of decision block 418 is negative then the flowchart branches to block 422 in which the run bit variable rb zero is set equal to one. After either block 420 or 422 the flowchart reaches block 424. In block 424 the variable j that points to successive code bits is incremented by one, the $j^{TH}$ code bit $V_j$ is set equal to the next bit variable nb and the nb variable is set equal to the emitted variable e.

Next decision block 426 tests if the run length variable rl is greater than zero. If so then the flowchart executes block 428 in which the variable j is incremented a $j^{TH}$ code bit $V_j$ is set equal to the run bit variable rb and the run length variable is decremented. After each execution of block 428 the flowchart loops back to block 426. When the outcome of block 426 is negative the flowchart escapes the loop and reaches decision block 430.

Decision block 430 test if i=M, i.e., if there are any remaining MSB portions in the sequence of MSB portions being coded. If more MSB portions remain to be processed then the flowchart loops back to decision block 410 and continues execution as described above. When it is determined in block 430 that there are no more MSB portions to be processed then the flowchart branches to decision block 432. Decision block 432 test if the variable j is equal to L which indicates a length of the arithmetic code. If not then the flowchart executes 434 in which a $j^{TH}$ code bit $V_j$ is set equal to one and j is incremented by one. From block 434 the flowchart loops back to decision block 432. When the outcome of block 434 is positive the arithmetic code is complete and the flowchart terminates.

FIG. 5 is a flowchart of an Arithmetic Decoder 310 that is used to decode the MSB portions of codes produced by another encoder (e.g., Factorial Pulse Coder). In block 502 an index i that references successive symbols being decoded is initialized to zero (to point to a first symbol); a integer j that points to successive code bits is initialized to zero (to point to a first code bit); a variable x which specifies a position in the arithmetic code space is initialized to zero (x will be built up based on code bit values); a variable y which specifies an interval width in the code space initialized to 1 and a variable n is set equal to $G_i^{max}$. Block 504 is a decision block, the outcome of which depends on whether y is less than $2^W$. W is a fixed precision used by the decoder 310. Initially the outcome of decision block 504 will be negative so that the flowchart will branch to decision block 506 which tests if the variable j is less than a fixed length parameter L. L indicates the length of the arithmetic code. Initially the outcome of decision block will be positive (j<L) so that the flowchart will branch to block 508. In block 508 the value of X is multiplied by two (left shifted one place) and the value of the code bit is added. (Note that initially X is simply set to the value of the code bit because X was initialized to zero. When, after processing all the code bits, the outcome of block 506 becomes negative, the flowchart branches to block 510 in which x is simply multiplied by 2 (without adding a code bit). After either block 508 or block 510 the flowchart reaches block 512 in which y is multiplied by 2. After block 512 the flowchart loops back to block 504 to again test if y is less than $2^W$. When, after processing all the code bits, and possibly left shifting x in 510 and left shifting y further in 512, it is determined in block 504 that y exceeds $2^W$, the flowchart branches to block 514. In block 514 a variable n-tilda (a temporary variable for an encoded symbol) is set equal to the floor function of (2xn+n−1)/2y. In block 516 a variable z which temporarily stores a width in the code space is set according to the equation given above for z.

Also in block 516 $G_i$, an $i^{TH}$ code word is set equal to n-tilda; the index i is incremented by one and the variable n is set equal to an $i^{TH}$ $G_i^{max}$ value. In block 518 the variable x is set decrement by the value of round(y*n−tilda/n)—basically removing the portion of the "height" (position) in the code space attributable to the preceding code bit. Also in block 518 the variable y which represents an interval in the code space is reset to z which represents the interval in the code space selected by preceding code bits. Decision block 520 tests if i is yet equal to M, i.e., if all symbols have been decoded. If not then the flowchart returns to block 504. If, on the other hand, all symbols have been recovered, then the flowchart terminates.

Recall that in connection with the description of the encoder above, it was stated that the arithmetic code word was L bits long. In theory in order to represent a number M of MSBs, $G_i$ which range up to $G_i^{max}$ it should be sufficient that L is set so that $2^L$ exceeds the product of the sequence of $G_i^{max}$ values. In practice when arithmetic coding is performed using finite precision arithmetic (e.g., using processor register of width such as 32 bits, the need for extra code bits arises. A Loose Bound (overestimate) for Arithmetic Coding (LBAC) for the number of extra code bits is given by the following equation.

$$\eta = \sum_{i=0}^{M-1} \log_2\left(\frac{1}{1 - 2^{-w} G_i^{max}}\right)$$

Note that the number of extra bits given by the preceding may actually evaluate to less than one in which case just one extra bit is required. Note also that the foregoing equation can be evaluated incrementally, that is for a partial sequence of less than M $G_i^{max}$ values.

Figure 6:
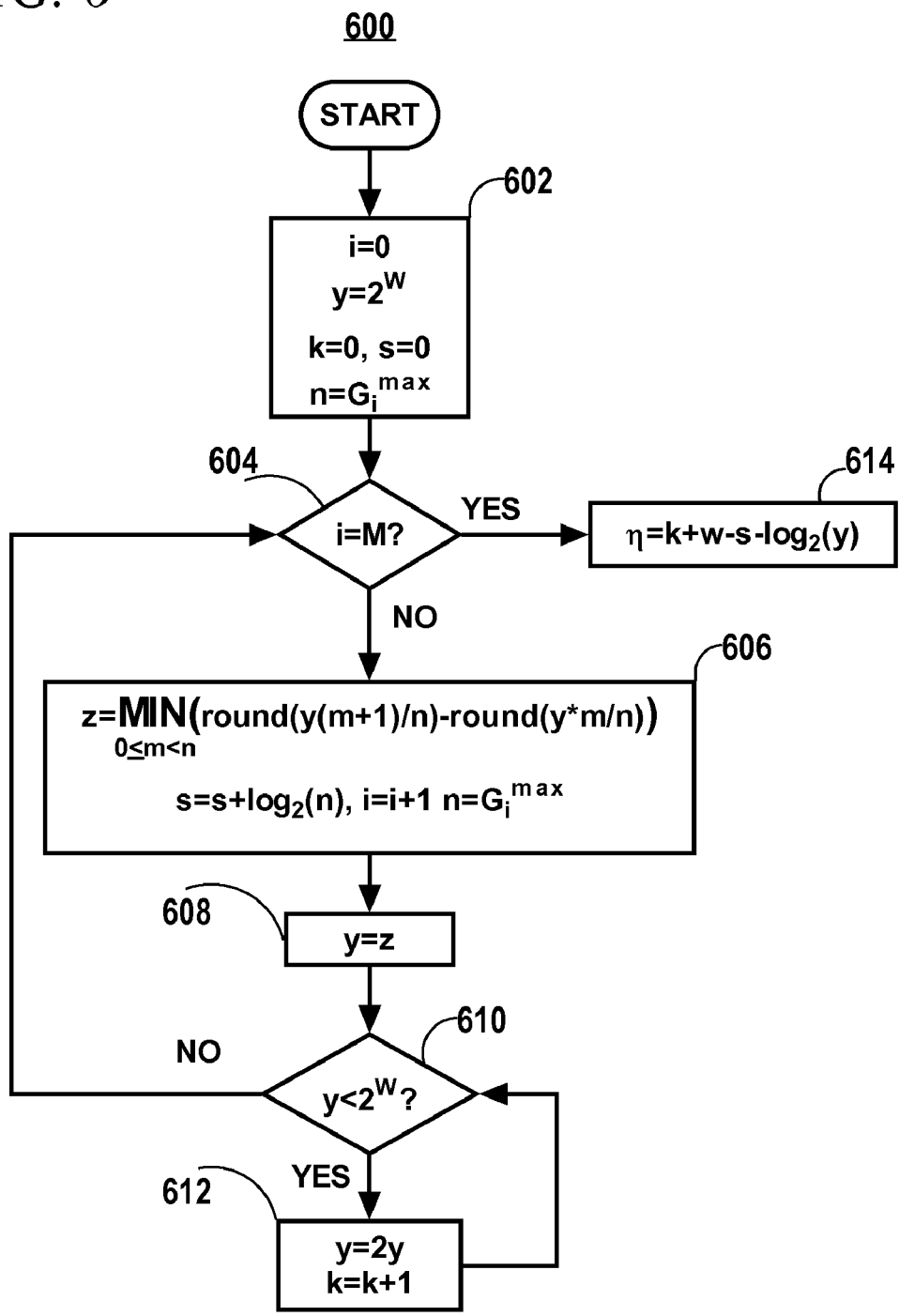
FIG. 6 is a flowchart of a process for determining an Arithmetic Coder coding efficiency term which represents a number of extra bits that are required when Arithmetic Coding with finite precision arithmetic.

A Tight Bound (more accurate) for Arithmetic Coding (TBAC) can be determined by a process that entails recursively selecting the smallest sub-range of the code space that can be selected by each symbol position in a hypothetical symbol sequence. The size of the smallest sub-range is related to $G_i^{max}$ for each $i^{TH}$ symbol position. FIG. 6 shows a flowchart for the process of determining the TBAC. In block 602 a variable i that points to successive maximum MSB portion values $G_i^{max}$ is initialized to zero; a code space sub-range width variable y is initialized to $2^W$, where W is a precision parameter; a variable k which counts a number of rescalings (left shifts) of y is initialized to zero; a variable s which relates to the product of the values in the $\log_2$ domain is initialized to zero; and a temporary variable n used to store $G_i^{max}$ values is initialized to a zeroth $G_i^{max}$ value $G_0^{max}$.

Decision block 604 tests if a last ($M^{TH}$) $G_i^{max}$ value has been processed. The TBAC flowchart can be executed for less than the full sequence of MSB portion values, in which case M in block 604 will be less than the total number of MSB portion values. If i is not yet equal to M the flowchart proceeds to block 606 in which a temporary variable z which stands for a code space sub-range width is set equal to the minimum sub-range width of all sub-range widths that can be assigned to an $i^{TH}$ symbol $G_i$ depending on its value. The expression for z, as shown in the flowchart is given by:

$$z = \min_{0 \le m < n}\left(\text{round}\left(\frac{y \cdot (\tilde{n}+1)}{n}\right) - \text{round}\left(\frac{y \cdot \tilde{n}}{n}\right)\right)$$

In fact it can be shown that z is inversely related to n ($G_i^{max}$) and is equal to:

$$z = \left\lfloor \frac{y}{n} \right\rfloor$$

Also in block 606 s is incremented by $\log_2(n)$; i is incremented by one and n is set to a new value of $G_i^{max}$. In block 608 y is set equal to z. Next decision block 610 tests if y is less than $2^W$. If so the flowchart loops through block 612 which multiplies y by 2 (left shifts y) and increments k by one. When it is determined in block 610 that y is not less than $2^W$, the flowchart loops back to decision block 604. When it is determined in block 604 that i=M, the flowchart proceeds to block 614 and the number of extra required code bits n is set equal to k+w−s−$\log_2$(y).

FIG. 7 is a flowchart of an efficient audio coder that uses Factorial Pulse Coding in combination with Arithmetic Coding to code a sequence of frequency bands that are sorted according to a measure related to spectral energy. The method allows FPC code words that have non-integer length to be efficiently encoded using Arithmetic Coding, while at the same time providing for redistribution of bits saved from an initial allocation to be redistributed to other bands. Although reference is made to audio bands in FIG. 7 is should be noted that the process is equally applicable to encoding other types of information. In other applications another version of signal energy may be used in lieu of spectral energy.

Block 702 indicates that the process shown below is repeated for successive audio frames. Although not shown explicitly in FIG. 7, the process can be applied to differentially encode information extracted from successive audio frames.

In block 704 a separate process (not-shown) is called to perform an initial allocation of bits to a sequence of frequency bands. (It is assumed at this point that the signal has been transformed to the frequency domain and frequency domain coefficients have been segregated into a number of bands.) Known processes for allocating bits to frequency bands can be used. One such known method is described in X. Wei, M. Shaw, M. Varley, "Optimum Bit Allocation and Decomposition for High Quality Audio Coding," icassp, vol. 1, pp. 315, 1997 IEEE International Conference on Acoustics, Speech, and Signal Processing (ICASSP'97)—Volume 1, 1997 The number of bits allocated to a frequency band can be a function of the energy in the frequency band. In the case of other types of information (e.g., image, video, telemetry) portions (analogous to audio frames) would be subdivided into sub-parts (e.g., frequency bands, or other type divisions).

In block 706 the bands are re-ordered (sorted) according to a measure related to spectral energy. The measure may be the spectral energy itself. Alternatively a weighted spectral energy may be arrived at by multiplying the spectral energy for each band by a preprogrammed weight associated with that band. There is some advantage in re-ordering the frequency bands so that bands with lower spectral energy are placed near the beginning of the ordering. A consequence of such an ordering is that bits tend to be re-allocated to bands with higher energy content, resulting higher fidelity of the representation of such bands.

Block 708 marks the top of a loop that is repeated for each $j^{TH}$ frequency band (taken in order according to the new ordering). In block 710 the number of unit-magnitude pulse quanta that can be encoded to represent the spectrum in the $j^{TH}$ band is calculated. This is calculated by using an equation that enumerates all the possible pulse configurations given that the number of pulse quanta is set at an integer value m. In a Factorial Pulse Coding system, the number of possible pulse configurations N is equal to the highest code value. One such equation is given in equation (15) of U.S. Pat. No. 6,236,960 which is assigned in common with the present invention and teaches a Factorial Pulse Coding method. Equation (15) of the '960 patent written out explicitly is:

$$N = \sum_{i=1}^{m} 2^i \cdot \frac{(m-1)!}{(i-1)!(m-i)!} \cdot \frac{(n)!}{i!(n-i)!}$$

where, n is the number of frequency bins in the $j^{TH}$ band;
   m is the number of pulse quanta;
   i is a summation index;

An analogous equation from a more advanced, less computationally intensive version of Factorial Pulse Coding is given by equation (21) in the paper Udar Mittal, James P. Ashley, and Edgardo M. Cruz-Zeno, "Low Complexity Factorial Pulse Coding Of MDCT Coefficients Using Approximation Of Combinatorial Functions", ICASSP, 2007. Whichever one of these, or similar, equations are used, they need not be inverted to obtain m in terms of N, rather they can be solved using a look up table of computed values or using a root finding method such as the bisection method. These equations are not continuous so in solving them, in this context, one seeks the value of m that produces a value of N that is the greatest value of N that is produced by the equation that is less than the bit allocation for the $j^{TH}$ frequency band in question. The value of $\log_2(N)$ is a feasible number of bits for the initial bit allocation. Accordingly, there will generally be some excess number of bits in the bit allocation for a given frequency band. The latter aspect of the solution process is referred to in block 712 of the flowchart.

If bits are allocated to the bands based on a measure of energy in the bands then the number of pulse quanta m corresponding to the number of bits allocated for the band is also related to the energy in the bands. This being the case one can re-order the bands based on a metric that is based on the number of pulse quanta m in lieu of re-ordering the bands based on band energy. One option is to re-order the bands based on m itself. The bands can be re-ordered in increasing order of m. Doing so means that bits will tend to be reallocated to bands with higher energy (more information content). Another option is to base the re-ordering on the metric $\log_2(N(n,m+1))-\log_2(N(n,m))$, where N and m are as defined in the preceding equation. This metric quantifies how the fractional bit increase associated with increasing the pulse quanta m by one. If this latter metric is used the bands can be re-ordered in decreasing order based on the metric. The consequence of this re-ordering is that typically a large number (not necessarily whole number) of bits will be re-allocated from bands with low values of m (low energy) to bands with high values of m (high energy) where they will have substantially greater effect on increasing the allowable value of m than if they were used in the band from which they were taken.

In block 714 the Most Significant Bit (MSB) portion (denoted $G_j^{max}$) of the highest code value N found in block 712 is selected. (Note that the band index has been changed from i to j to avoid confusion with the summation index in the preceding equations.) (According to certain embodiments of the invention the length of the MSB portion for all frequency bands is fixed at a predetermined number of bits. If this is done, in cases where the entire bit length of N is less than or equal to the predetermined number of bits, then the entire value N is treated as the MSB for the particular band.)

In block 716 a sub-process is called to determine if Arithmetic Coding of the MSBs up to this band will require additional bits beyond the initial allocation. The sub-process referred to here evaluates the LBAC or the TBAC described above and in the latter case described with reference to FIG. 6. Decision block 718 tests if additional bits are required. Additional bits would be required if the number of extra bits determined by the Arithmetic Coding efficiency exceeds the number of extra bits remaining after using one of the Factorial Pulse Coding enumeration formulas to establish the number of pulse quanta m. If it is determined in block 718 that additional bits are required the flowchart branches to block 720 which resets m to a lower value. For example m can be decremented by a fixed amount or based on an expression involving m and the required number of extra bits. After m is decremented, in block 722 the highest code value N is recomputed and the MSB portion $G_j^{max}$ is selected. After block 722 the flowchart loops back to block 716 in order to recompute the Arithmetic Coding efficiency and recheck if the total number of bits required to Arithmetic Encode the MSBs up to the $j^{TH}$ band falls within the allocation. When the outcome of decision block 718 is negative meaning that no additional bits are required and no adjustment of the number of pulse quanta is required, the flowchart branches to block 724 in which excess (residual) bits remaining from the original allocation are distributed to other bands. The manner of allocating excess bits to other bands can vary. One way is to divide the bits evenly among remaining bands. Another way is to skew the distribution so that bands closer to the end of the ordering which contain more spectral energy receive relatively more bits.

In block 726 a Factorial Pulse Coding code word is computed to represent the band. This may be done according to the teachings of the aforementioned '960 patent or the aforementioned paper Udar Mittal, James P. Ashley, and Edgardo M. Cruz-Zeno, "*Low Complexity Factorial Pulse Coding Of MDCT Coefficients Using Approximation Of Combinatorial Functions*", ICASSP, 2007. In block 728 the MSB of the code word is selected and in block 730 an arithmetic coder sub-process is called to start (or continue in the case of executions of block 730 after the first execution) generating an Arithmetic Code to represent the MSBs. The arithmetic encoder described with reference to FIG. 4 may be used. Thus the process shown in FIG. 4 would be executed incrementally as each new MSB ($G_i$) value is generated by the process shown in FIG. 7. In block 732 the Least Significant Bit of the FPC code word is output to a concatenator.

Decision block 734 tests if more bands remain to be processed. If so then in block 736 the process is incremented to a successive band in the ordering and the flowchart loops back to block 710 in order to begin processing the next frequency band. When it is determined, in block 734, that all bands have been processed the flowchart branches to block 738 in which the spectral energies of the bands and/or other information is output to the packet assembler.

The following examples illustrate bit reallocation among the bands with and without re-ordering of the bands. Assuming first that the frequency bands are not re-ordered and that the $j^{TH}$ and $j^{TH}+1$ frequency bands are allocated 24.0 and 20.5 bits respectively. Furthermore, let us assume that the frequency bandwidth (number of positions) is fixed at n=20 for the $j^{TH}$ and $j^{TH}+1$ frequency bands. For the $j^{TH}$ frequency band, it can be determined that the maximum number of pulse quanta m that can be used while staying below the initial bit allocation of 24.0 is 6, and that the number of bits required to code 6 pulse quanta in the $j^{TH}$ band is $\log_2(N(20,6))=22.48$ bits. In this example, m=6 is the largest integer that keeps $\log_2(N(n,m))$ under the bits budget of 24.0 bits; an increase of one pulse quanta m=7 would require $\log_2(N(20,7))=25.02$ bits. Now, by moving the bit surplus of 24.0−22.48=1.52 bits to the $j^{TH}+1$ frequency band, we increase the bit budget for the $j^{TH}+1$ frequency band to 20.5+1.52=22.02 bits. In calculating the number of pulse quanta m for the $j^{TH}+1$ band, we find that we can code m=5 pulses using $\log_2(N(20,5))=19.72$ bits.

At this point, we can readily make two observations. First, the reallocating of the 1.52 bits from the $j^{TH}$ to the $j^{TH}+1$ frequency bands had no positive effect. That is, the added bits did not allow an increase in the number of pulse quanta m in the $j^{TH}+1$ frequency band. Secondly, assuming that the $j^{TH}+1$ frequency band was the last band in the sequence of bands, then the bit surplus (22.02−19.72=2.30 bits) may be wasted.

Now let us consider, in accordance with an embodiment of the present invention, an example where there is re-ordering of the frequency bands based on some function of the band energy. If we assume that the $j^{TH}$ and $j^{TH}+1$ frequency bands are the final bands in the sequence of bands and that the sorting is done based on a monotonically increasing function of band energy, and we assume that more bands are allocated to bands with more energy, then we can assume that these bands will contain the greatest number of bits. For example, let it be assumed that the bits allocated to these bands are 60.5 and 64.0 bits, respectively. As in the previous example, let us assume that the frequency bandwidth is fixed at n=20. For the $j^{TH}$ frequency band, it can be determined that the maximum number of pulse quanta m can be determined to be m=33, and that the number of bits required to code 33 pulse quanta is $\log_2(N(20,33))$=59.80 bits. By reallocating the bit surplus of 60.5−59.80=0.70 bits to the $j^{TH}$+1 frequency band, we increase the bit budget for the band to 64.0+0.70=64.70 bits. In calculating the number of pulse quanta m for the $j^{TH}$+1 band, we find that we can code m=39 pulses using $\log_2(N(20, 39))$=64.18 bits. In this case, in contrast to the preceding case the bits added to the second band do allow for m to be increased, thereby contributing to an increase in signal quality.

Generally speaking it is the case that as the number of bits increases, the number of bits required to code an additional pulse quanta decreases. Thus, the reallocation of surplus bits becomes less of an issue when incorporating the re-ordering based on some function of the energy, and furthermore, the potential for wasted bits after coding all bands becomes lower because of the lower cost per pulse quanta in higher energy bands.

In the embodiments described above the actual allocation for the bands processed first in the re-ordered sequence tends to be less than the initial allocation performed in block 704 and bits are re-allocated to bands that are placed later in the re-ordering. Also, according to blocks 710-712 described above the number of pulse quanta m was set to the largest value such that the number of bits $\log_2(N)$ required to code m pulse quanta was less than the initial allocation. According to alternative embodiments the re-ordering order of the bands can be reversed so that bands with higher energy or higher numbers of pulse quanta or lower values of the metric $\log_2(N(m+1))-\log_2(N(m))$ come first. In such embodiments rather than finding the value of m such that the corresponding N is the largest feasible number below the initial bit allocation, one can find the value of m such that the corresponding value of $\log_2(N)$ is larger than the initial bit allocation (e.g., the smallest value $\log_2(N(m))$ that is larger than the initial bit allocation. For such an embodiment this value of $\log_2(N)$ would be the feasible number of bits. In such embodiments rather than distributing excess bits to bands further along in the ordering, one can take bits from bands further down in the ordering in order to make up the difference (residual) between the value of $\log_2(N(m))$ and the initial bit allocation. The re-ordering performed in certain embodiments is based on priority, but may be either in order of increasing priority or decreasing priority.

The spectral energies of the bands and/or other information (e.g., band weights) will be sent to the receiver, so that the decoder of the receiver can reconstruct the ordering and the bit allocation that was performed by the encoder, so that the decoder is able to properly interpret the coded information it receives. The receiver will also execute blocks 702-724 in order to obtain the values of $G_j^{max}$. The values of $G_j^{max}$ along with the values of $G_j$ which are received through the channel will then be used by the receiver to perform the Arithmetic Decoding described above with reference to FIG. 5 in order to re-obtain the MSBs of the FPC code words which will then be reintegrated with the LSBs received from the transmitter in one concatenated sequence. Then the FPC code words will be decoded in order to reconstruct the band spectral energy distributions.

In the foregoing specification, specific embodiments of the present invention have been described. However, one of ordinary skill in the art appreciates that various modifications and changes can be made without departing from the scope of the present invention as set forth in the claims below. For example, Factorial Pulse Coding has been cited as an example of a coding method that may benefit from the present invention, however, many other combinatorial coding schemes may also benefit accordingly.

Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of digitally encoding information comprising:
   dividing a block of digital information to be encoded into a plurality of sub-parts;
   determining a priority based ordering for said plurality of sub-parts and processing said plurality of sub-parts in order according to said priority based ordering;
   for each $K^{TH}$ sub-part of at least a sub-set of said plurality of sub-parts: determining an initial bit allocation for representing said $K^{TH}$ sub-part;
   determining a first feasible number of bits that is not equal to said initial bit allocation and that can actually be used to represent said $K^{TH}$ sub-part in a first coding scheme;
   determining a residual number of bits that is based, at least in part, on said initial bit allocation and said first feasible number of bits;
   re-allocating bits among said $K^{TH}$ sub-part and sub-parts beyond said $K^{TH}$ sub-part in said priority based ordering in order adjust said initial bit allocation of said $K^{TH}$ sub-part to said first feasible number of bits; and
   encoding said $K^{TH}$ sub-part using, at least, said first coding scheme to produce a $K^{TH}$ first type code.

2. The method of digitally encoding information according to claim 1 wherein said initial bit allocation is established is based on a measure that is related to information content of said $K^{TH}$ sub-part.

3. The method of digitally encoding information according to claim 2 wherein said measure that is related to information content is based, at least in part, on signal energy.

4. The method of digitally encoding information according to claim 1 wherein determining said priority based ordering for said sub-parts comprises determining said priority based ordering based at least in part on a measure of energy in said sub-parts.

5. The method of digitally encoding information according to claim 1 wherein said priority ordering is based on an integer parameter of said first coding scheme that quantifies an amount of information to be coded.

6. The method of digitally encoding information according to claim 5 wherein said first coding scheme is a combinatorial coding scheme and said integer parameter is a number m of pulse amplitude quanta to be used for coding each of said plurality of sub-parts.

7. The method of digitally encoding information according to claim 5 wherein said priority ordering is based on a metric $\log_2(N(n,m+1))-\log_2(N(n,m))$ that quantifies how an increase in m by one increases a fractional bit size, wherein N(n,m) also corresponds to a number of possible pulse combinations in said combinatorial coding scheme.

8. The method of digitally encoding information according to claim 7 wherein said combinatorial coding comprises Factorial Pulse Coding.

9. The method of digitally encoding information according to claim 1 wherein, said first feasible number of bits is less than said initial allocation of bits for said $K^{TH}$ band and re-allocating comprises re-allocating said residual number of bits to other sub-parts that are beyond said $K^{TH}$ sub-part in said ordering.

10. The method of digitally encoding information according to claim 9 wherein said sub-parts are processed in order from lowest priority to highest priority.

11. The method of digitally encoding information according to claim 1 wherein, said first feasible number of bits is greater than said initial allocation of bits for said $K^{TH}$ band and re-allocating comprises adding one or more bits that were initially allocated to bands other than said $K^{TH}$ band to said $K^{TH}$ band.

12. The method of digitally encoding information according to claim 11 wherein said sub-parts are processed in order from highest priority to lowest priority.

13. The method of digitally encoding information according to claim 1 wherein:
determining a residual number of bits, comprises determining a residual number of bits based at least in part on a coding efficiency of a second coding scheme; and
said method further comprises coding at least a portion of said $K^{TH}$ first type code using said second coding scheme to produce a second type code.

14. The method of digitally encoding information according to claim 13 wherein said at least portion of said $K^{TH}$ first code comprises a Most Significant Bits portion of said $K^{TH}$ first type code.

15. The method of digitally encoding information according to claim 14 wherein said second coding scheme comprises Arithmetic Coding.

16. The method of digitally encoding information according to claim 15 wherein said first coding scheme comprises combinatorial coding.

17. The method of digitally encoding information according to claim 1 wherein determining said first feasible number of bits comprises determining a largest value (m) of pulse quanta summed over a pulse configuration that corresponds to a number of different possible pulse configurations (N) that have m pulse quanta, wherein said largest number N can be represented with no more than said initial bit allocation.

18. A method of digitally encoding information comprising:
dividing a block of information into a plurality of sub-parts;
performing an initial allocation of bits to a $K^{TH}$ sub-part of said plurality of sub-parts;
computing an arithmetic coding efficiency for encoding said $K^{TH}$ sub-part;
adjusting said initial allocation of bits to said $K^{TH}$ sub-part based, at least in part, on said arithmetic coding efficiency to obtain an adjusted bit allocation for said $K^{TH}$ sub-part; and
encoding said $K^{TH}$ sub-part using said adjusted bit allocation for said $K^{TH}$ sub-part.

19. The method of digitally encoding information according to claim 18 wherein said step of adjusting said initial allocation of bits further comprises:
determining a feasible integer parameter of a combinatorial coding scheme and determining a bit requirement corresponding to said feasible integer parameter; and
adjusting said initial allocation based in-part on said bit requirement corresponding to said feasible integer parameter; and
wherein said step of encoding comprises encoding using said combinatorial encoding scheme.

20. A method of digitally encoding information comprising:
dividing a block of information into a plurality of sub-parts;
performing an initial allocation of bits to a $K^{TH}$ sub-part of said plurality of sub-parts;
for each $K^{TH}$ sub-part:
determining a maximum number of pulse amplitude quanta m that can be encoded using Factorial Pulse Coding while using less than a bit allocation for said $K^{TH}$ sub-part;
determining a number of bits corresponding to said maximum number of pulses;
determining a number of extra bits required to encode at least a portion of a Factorial Pulse Coding Code for said $K^{TH}$ sub-part and preceding sub-parts using Arithmetic Coding;
adding said number of extra bits to said number of bits corresponding to said maximum number of pulses and comparing a resulting sum to said initial allocation of bits for said $K^{TH}$ sub-band;
when said resulting sum exceeds said initial allocation:
decrementing said maximum number of pulses and re-determining a number of bits corresponding to said maximum number of pulses;
when said resulting sum is less than said initial allocation;
coding said $k^{TH}$ sub-part using Factorial Pulse Coding to obtain a $K^{TH}$ factorial pulse code;
coding at least a portion of said $K^{TH}$ factorial pulse code using Arithmetic Coding; and
reallocating bits remaining after Factorial Pulse Coding and Arithmetic Coding to remaining sub-parts.

21. The method according to claim 20 further comprising:
re-ordering said sub-parts and encoding said sub-parts in order according to said re-ordering.

22. The method according to claim 21 wherein said re-ordering is based on a measure related to information content of said sub-parts.

23. The method according to claim 22 where said measure related to information content of said sub-parts is based on signal energy.

* * * * *